United States Patent [19]

Walding

[11] 3,747,030

[45] July 17, 1973

[54] BAND PASS FILTER WITH TRANSMISSION LINE SECTION

[75] Inventor: Eugene C. Walding, Arlington Heights, Ill.

[73] Assignee: Oak Electro/Netics Corp., Crystal Lake, Ill.

[22] Filed: June 7, 1971

[21] Appl. No.: 150,580

[52] U.S. Cl. .................................... 333/73, 333/76

[51] Int. Cl. ......................... H03h 7/10, H03h 9/00

[58] Field of Search ...................... 333/73, 76, 73 C

[56] References Cited

UNITED STATES PATENTS

| | | | |
|---|---|---|---|
| 2,270,416 | 1/1942 | Cork et al. | 333/73 |
| 2,196,272 | 4/1940 | Peterson | 333/73 |
| 2,281,621 | 5/1942 | Rust et al. | 333/73 X |
| 2,248,751 | 7/1941 | Frankel | 333/73 X |
| 3,530,405 | 8/1970 | Luzzatto | 333/76 X |
| 3,452,303 | 6/1969 | Babcock | 333/76 |
| 3,197,720 | 7/1965 | Dehn | 333/76 X |

*Primary Examiner*—Rudolph V. Rolinec
*Assistant Examiner*—Saxfield Chatmon, Jr.
*Attorney*—Parker, Plyer & McEachran

[57] ABSTRACT

A filter circuit formed of inductive and capacitive elements and arranged to pass a predetermined band of frequencies. A transmission line section having a length equal to one-fourth of the wave length of a predetermined frequency above the pass band is connected either at the filter input, the filter output, or at each end of the filter to provide high attenuation at the predetermined frequency.

5 Claims, 2 Drawing Figures

PATENTED JUL 17 1973 3,747,030

INVENTOR.
Eugene C. Walding
BY Parker, Carter & Markey
Attorneys.

BAND PASS FILTER WITH TRANSMISSION LINE SECTION

SUMMARY OF THE INVENTION

The present invention relates to a filter arranged to pass a band of frequencies and to provide substantial attenuation at a predetermined specific frequency above the pass band.

Another purpose is a filter of the type described suitable for use in a cable television converter.

Another purpose is a filter utilizing quarter wave length transmission line sections to provide an effective short circuit at the filter input or output or both.

Another purpose is a bandpass filter using quarter wave length transmission line sections to attenuate predetermined frequencies above the pass band.

Other purposes will appear in the ensuing specification, drawings and claims.

BRIEF DESCRIPTION OF THE DRAWINGS

The invention is illustrated diagrammatically in the following drawings wherein.

DESCRIPTION OF THE PREFERRED EMBODIMENT

The present invention is useful in a cable television converter, particularly as a filter connected in front of the pre IF amplifier. The filter in that position is effective to remove certain frequencies which might pass back through the pre IF amplifier from a second local oscillator toward a first local oscillator and the mixer connected thereto. In effect, the filter prevents any interference between the two local oscillators and prevents any frequencies from the second local oscillator in the converter from causing interference at the mixer connected to the first local oscillator. Obviously the invention has substantially wider application, but the above is a specific use for the circuit described herein.

Figure 1:
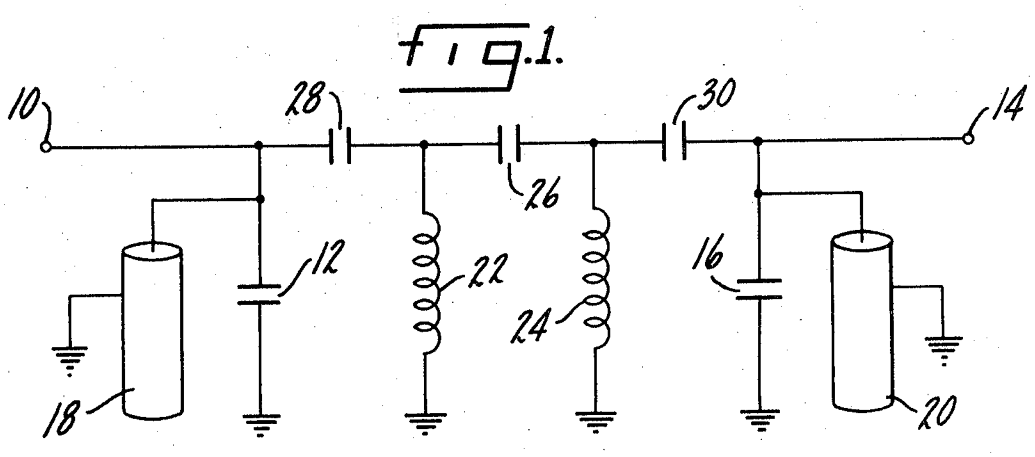
FIG. 1 is a schematic diagram illustrating one form of the invention.

In FIG. 1 the filter input is indicated at 10 and a capacitor 12 may be connected across the input. The output of the filter is indicated at 14 and there may be a capacitor 16 connected across the output. A pair of transmission line sections are indicated at 18 and 20 with section 20 being connected in parallel with the output capacitor 16 and transmission line section 18 being connected in parallel with the input capacitor 12. The transmission line sections may each be conventional coaxial cable having a length equal to a quarter wave length of a particular frequency which is to be removed by the filter. The characteristic impedance of the transmission line will be the same as that of the filter, for example 75 ohms.

The filter may include a pair of coils 22 and 24 connected together by a capacitor 26. Capacitors 28 and 30 are connected between coils 22 and 24 and the input and output capacitors 12 and 16. The filter itself is conventional and will be tuned to pass a particular band of frequencies.

As a specific example of the invention, the elements in FIG. 1 may have the following values:

| | |
|---|---|
| Capacitor 12 | 5 pf |
| Capacitor 28 | 5.1 pf |
| Capacitor 26 | 0.82 pf |
| Capacitor 30 | 5.1 pf |
| Capcitor 16 | 5 pf |
| Coil 22 | |
| Coil 24 | |

Figure 2:
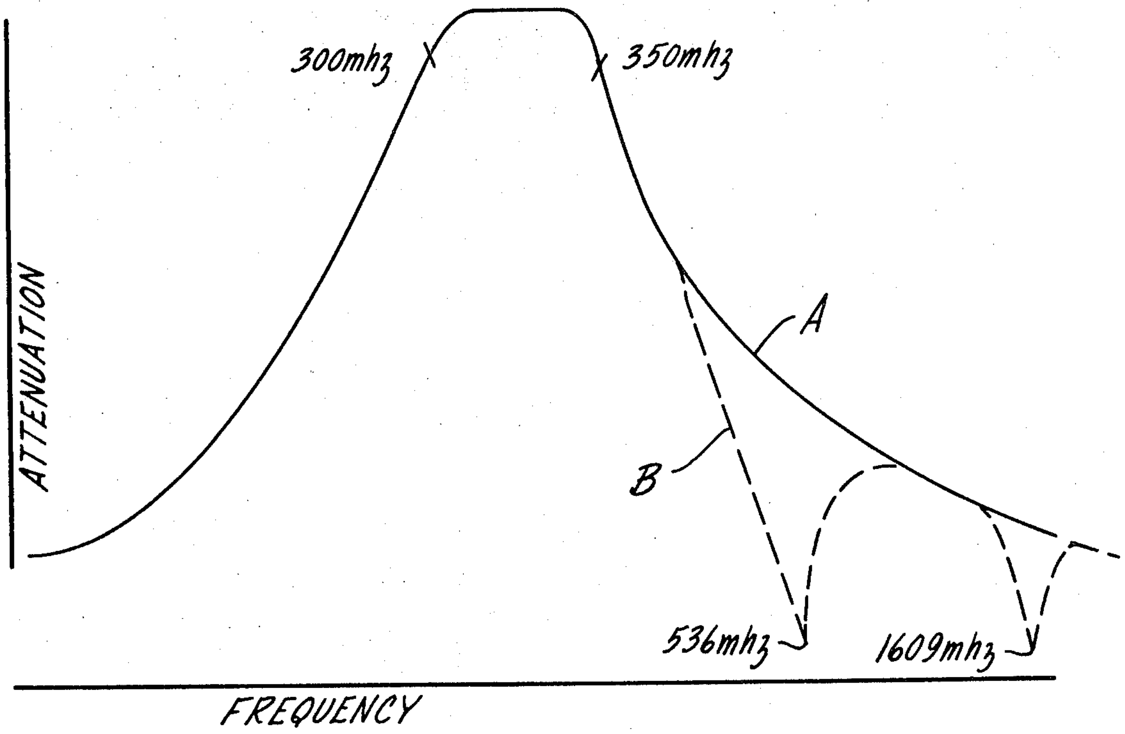
FIG. 2 is a curve of attenuation vs. frequency for a specific example of the filter illustrated in FIG. 1.

Using the values above, the filter may pass a band of frequencies between 300 and 350 mhz. To attenuate specific frequencies, for example 536 mhz and 1,609 mhz, transmission line sections 18 and 20 will each have a length equal to a quarter wave length at 536 mhz. Thus, in the pass band of frequencies the two transmission line sections will have an effective capacity of approximately 5 pf so that the actual input capacity and the output capacity will be 10 pf, as there are two 5 pf capacitors in parallel at the input and the output. At 536 mhz there is an effective short circuit at both the input and the output as shown in the curve of FIG. 2. Not only will 536 mhz be highly attenuated, but odd harmonic multiples of this frequency will also have high attenuation. For example, a signal having a frequency of 1,609 mhz, which is the third harmonic of 536 mhz, will also be highly attenuated and effectively removed by the filter.

Although FIG. 1 shows a transmission line section at both the input and the output, it is equally satisfactory to have a transmission line section at one or the other position. It is not necessary to have a transmission line section at both the input and the output. Using the figures set forth above, if the transmission line section is only at the output, then capacitor 12 will be a 10 pf capacitor and the value of capacitor 16 will be 5 pf. Thus the input and output capacity will be equal as the effective capacity of transmission line section 20 in the pass band of frequencies is 5 pf.

The same is true if a transmission line section is only used at the input. In this case the output capacitor would be 10 pf and the input capacitor 12 would be 5 pf as again the transmission line section 18 would have an effective capacity of 5 pf in the pass band of frequencies.

The invention should not be limited to any particular type of filter, as what is important is to have a bandpass filter in which it is desired to provide high attenuation at a pre-determined frequency or frequencies above the pass band. In this connection, the input and output transmission line sections may be arranged to attenuate the same frequency, or they may be arranged to attenuate different frequencies. Effectively they provide a short circuit at the input or the output or both at a predetermined frequency or frequencies.

FIG. 2 illustrates the relationship of attenuation to frequency. Curve is the attenuation curve without the added transmission line sections. The dotted line, curve B, indicates the attenuation at 536 mhz and 1,609 mhz due to the addition of one or more transmission line sections, as illustrated in FIG. 1.

Whereas the preferred form of the invention has been shown and described herein, it should be realized that there may be many modifications, substitutions and alterations thereto.

I claim:

1. A filter circuit including an input and an output, a plurality of inductive and capacitive elements connected between the input and output forming a bandpass filter, a transmission line section having the same characteristic impedance as the bandpass filter connected in parallel with the filter at its output, said transmission line section having a length equal to one-fourth of the wave length of a predetermined frequency above the pass band of frequencies to provide an effective short circuit in parallel with the filter at its output at said predetermined frequency, input and output capacitors, said output capacitor being in parallel with said transmission line section, and said input capacitor being in parallel with the filter input.

2. The filter circuit of claim 1 further characterized in that said transmission line section has a capacity, in the pass band of frequencies approximately equal to that of the output capacitor.

3. A filter circuit including an input and an output, a plurality of inductive and capacitive elements connected between the input and output forming a bandpass filter, a transmission line section having the same characteristic impedance as the bandpass filter connected in parallel with the filter at its input, said transmission line section having a length equal to one-fourth of the wave length of a predetermined frequency above the pass band of frequencies to provide an effective short circuit in parallel with the filter at its input at said predetermined frequency, input and output capacitors, said input capacitor being in parallel with said transmission line section, said output capacitor being in parallel with the filter output.

4. The filter circuit of claim 4 further characterized in that said transmission line section has a capacity, in the pass band of frequencies, approximately equal to that of said input capacitor.

5. A filter circuit including an input and an output, a plurality of inductive and capacitive elements connected between the input and output forming a bandpass filter, a transmission line section having the same characteristic impedance as the bandpass filter connected in parallel with the filter at its input, a second transmission line section having the same characteristic impedance as the bandpass filter connected in parallel with the filter at its output, both of said transmission line sections having a length equal to one-fourth of the wave length of predetermined frequencies above the pass band of frequencies to provide an effective short circuit in parallel with the filter input and output at said predetermined frequencies, input and output capacitors connected in parallel with said input and output transmission line sections, said transmission line sections each having generally the same capacity, in the pass band frequencies, as the input and output capacitors, with the capacity of said transmission line sections being generally equal.

* * * * *